(12) United States Patent
Shimizu et al.

(10) Patent No.: US 9,391,437 B2
(45) Date of Patent: Jul. 12, 2016

(54) ELECTRICAL JUNCTION BOX

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Tatsuya Shimizu, Mie (JP); Takehiro Mizuno, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 103 days.

(21) Appl. No.: 14/377,289

(22) PCT Filed: Feb. 15, 2013

(86) PCT No.: PCT/JP2013/053666
§ 371 (c)(1),
(2) Date: Aug. 7, 2014

(87) PCT Pub. No.: WO2013/129137
PCT Pub. Date: Sep. 6, 2013

(65) Prior Publication Data
US 2015/0303666 A1    Oct. 22, 2015

(30) Foreign Application Priority Data

Feb. 27, 2012   (JP) ................. 2012-039826

(51) Int. Cl.
| | |
|---|---|
| *H02G 3/08* | (2006.01) |
| *H02G 3/16* | (2006.01) |
| *B60R 16/023* | (2006.01) |
| *H05K 5/00* | (2006.01) |
| *H02G 3/10* | (2006.01) |

(52) U.S. Cl.
CPC ............ *H02G 3/088* (2013.01); *B60R 16/0238* (2013.01); *H02G 3/08* (2013.01); *H02G 3/081* (2013.01); *H02G 3/16* (2013.01); *H05K 5/0056* (2013.01); *H02G 3/10* (2013.01)

(58) Field of Classification Search
USPC ............................................ 174/50
See application file for complete search history.

(56) References Cited

U.S. PATENT DOCUMENTS 7,633,008 B2 *  12/2009  Kanou ............... H02G 3/088
                                                   174/17 R
2006/0021779 A1   2/2006  Kanazawa
2006/0260834 A1  11/2006  Kanazawa et al.

FOREIGN PATENT DOCUMENTS

| JP | U-63-59383 | 4/1988 |
|---|---|---|
| JP | U-3-50388 | 5/1991 |
| JP | U-3-81682 | 8/1991 |
| JP | A-2006-74988 | 3/2006 |

OTHER PUBLICATIONS

International Search Report dated Mar. 19, 2013 from International Patent Application No. PCT/JP2013/053666 (with English-language translation).

* cited by examiner

*Primary Examiner* — Dhirubhai R Patel
(74) *Attorney, Agent, or Firm* — Oliff PLC

(57) ABSTRACT

An electrical junction box includes a circuit structure and a casing in which the circuit structure is accommodated. The casing includes a case including a case-side peripheral wall portion that extends upright from a peripheral edge of a bottom plate portion, the case having an opening that opens to a lateral side, and accommodating the circuit structure inside, and a cover closing the opening of the case and including a cover-side peripheral wall portion that extends upright from a peripheral edge of a lid plate portion and covers a perimeter of the case-side peripheral wall portion. In a state in which the cover and the case are assembled, a protruding end of the cover-side peripheral wall portion extends to at least such a position that its protruding end is substantially flush with an outer surface of the bottom plate portion.

8 Claims, 8 Drawing Sheets

ELECTRICAL JUNCTION BOX

BACKGROUND

The present application relates to an electrical junction box.

Conventionally, some of the electrical junction boxes that are disposed in submersible regions of engine compartments of automobiles are provided with a waterproof structure that prevents water from entering the inside of the electrical junction boxes (see JP 2006-74988A).

SUMMARY

Unlike the electrical junction boxes disposed in engine compartments and the like, electrical junction boxes that are disposed in passenger compartments do not require an advanced waterproof structure and require merely a water blocking structure that does not allow water to easily enter the inside even if a small amount of water such as a glass of water splashes onto the electrical junction boxes.

Applying an advanced waterproof structure as disclosed in the aforementioned document to such electrical junction boxes increases unnecessary cost, and therefore there is room for improvement.

The present application was made in view of the circumstances as described above, and it is an object thereof to provide an electrical junction box having a water blocking structure that suppresses entry of water to the inside of a case and resulting adhesion of water to a circuit structure at low cost.

The present application is an electrical junction box including a circuit structure and a casing in which the circuit structure is accommodated, the casing including a case including a bottom plate portion and a case-side peripheral wall portion that extends upright from a peripheral edge of the bottom plate portion, the case having an opening that opens to a lateral side, and accommodating the circuit structure inside, and a cover closing the opening of the case and including a lid plate portion and a cover-side peripheral wall portion that extends upright from a peripheral edge of the lid plate portion and covers a perimeter of the case-side peripheral wall portion, wherein in a state in which the cover and the case are assembled, a protruding end of the cover-side peripheral wall portion extends to at least such a position that the protruding end is substantially flush with an outer surface of the bottom plate portion.

DETAILED DESCRIPTION

Figure 1:
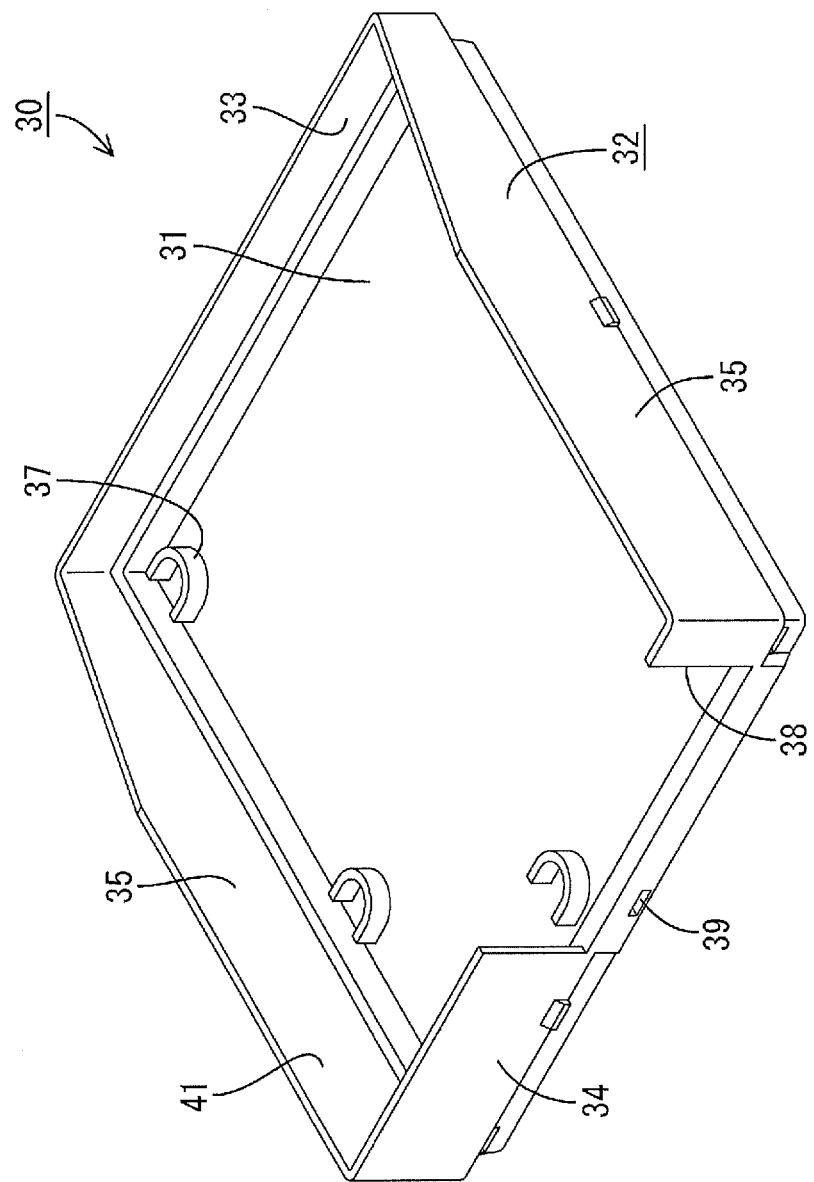
FIG. 1 is a perspective view of a case according to an embodiment.

In the electrical junction box of the application, in the state in which the case and the cover are assembled, the peripheral wall portion of the casing has a double structure constituted by the case-side peripheral wall portion and the cover-side peripheral wall portion, and thus the circuit structure is surrounded by a double wall. Therefore, entry of water to the inside of the casing and resulting adhesion of water to the circuit structure are suppressed.

Also, with this configuration, the entire outer peripheral surface of the case-side peripheral wall portion is covered by the cover-side peripheral wall portion. Accordingly, it is possible to avoid a situation in which water adheres to a surface of the case-side peripheral wall portion that is exposed from the cover-side peripheral wall portion, and the adhering water enters the inside of the casing through a space between the case-side peripheral wall portion and the cover-side peripheral wall portion by capillary action. Thus, entry of water to the inside of the casing and resulting adhesion of water to the circuit structure can be more reliably avoided.

The electrical junction box according to the present application more preferably has the following configurations in addition to the above-described configuration.

It is also possible that the cover includes an inner wall portion extending upright such that, in a state in which the cover and the case are assembled, the inner wall portion is located at a position to the inside of the case-side peripheral wall portion with a space provided between the case-side peripheral wall portion and the inner wall portion, and the circuit structure is received on the inside of the inner wall portion.

With this configuration, in the state in which the case and the cover are assembled, the peripheral wall portion has a triple structure that is constituted by the case-side peripheral wall portion, the cover-side peripheral wall portion, and the inner wall portion, and thus the circuit structure is surrounded by a triple wall. Therefore, entry of water to the inside of the casing and resulting adhesion of water to the circuit structure are even more reliably avoided.

Furthermore, it is preferable that the circuit structure includes a circuit board and electronic components mounted on a mounting surface of the circuit board, the circuit board is accommodated in the case such that the mounting surface faces the opening, and in a state in which the circuit structure is accommodated in the casing, a protruding end of the inner wall portion extends to at least such a position that the protruding end is substantially flush with a non-mounting surface of the circuit board on which the electronic components are not mounted.

With this configuration, even if water enters the inside of the cover-side peripheral wall portion, the water moves on an outer peripheral surface of the inner wall portion and is guided to the side of the non-mounting surface of the circuit board. Thus, even if water enters the inside of the casing, adhesion of the water to the mounting surface of the circuit board on which the electronic components are mounted can be avoided.

Moreover, a water blocking structure as described above can be attained with a relatively small increase in cost as compared with a case structure with respect to which no countermeasure is taken. Thus, an electrical junction box having a water blocking structure can be provided at low cost.

According to the present application, it is possible to provide an electrical junction box having a water blocking structure that suppresses entry of water into the inside of a case and resulting adhesion of water to a circuit structure at low cost.

Figure 2:
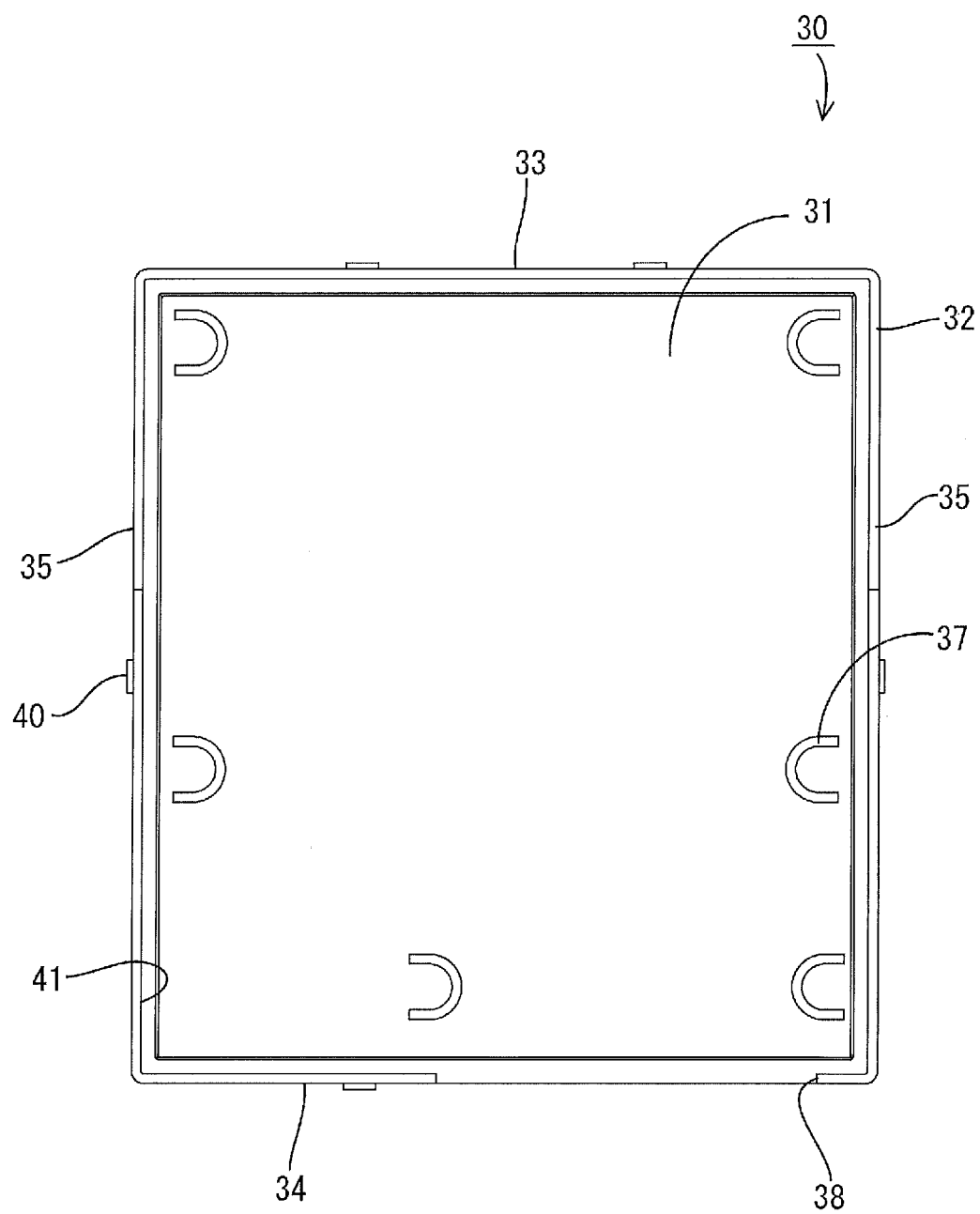
FIG. 2 shows the case according to the embodiment as seen from the side of an opening.
Figure 3:
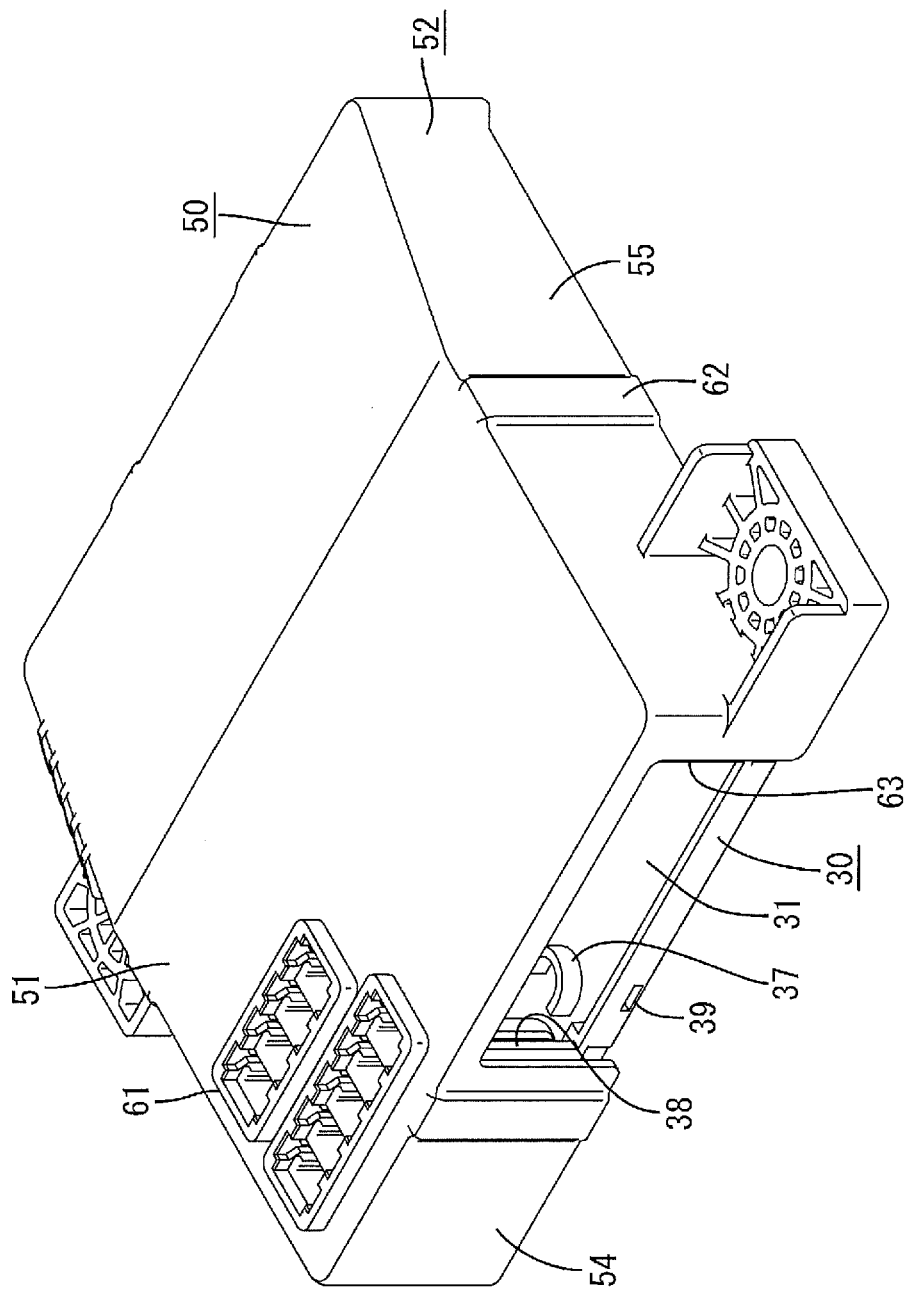
FIG. 3 is a perspective view showing a state in which the case and a cover according to the embodiment are assembled.
Figure 4:
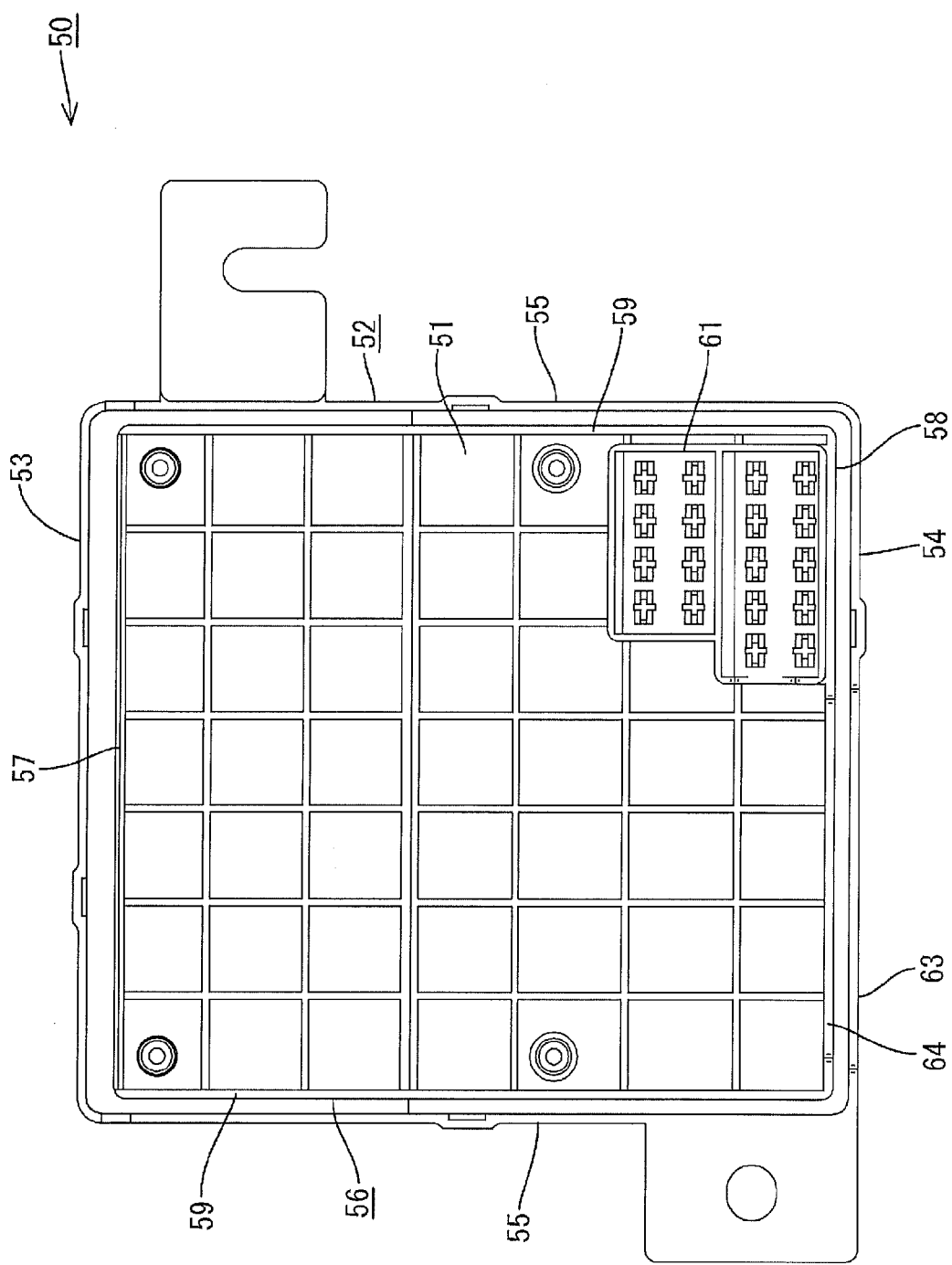
FIG. 4 shows the cover according to the embodiment as seen from the side of the opening.
Figure 5:
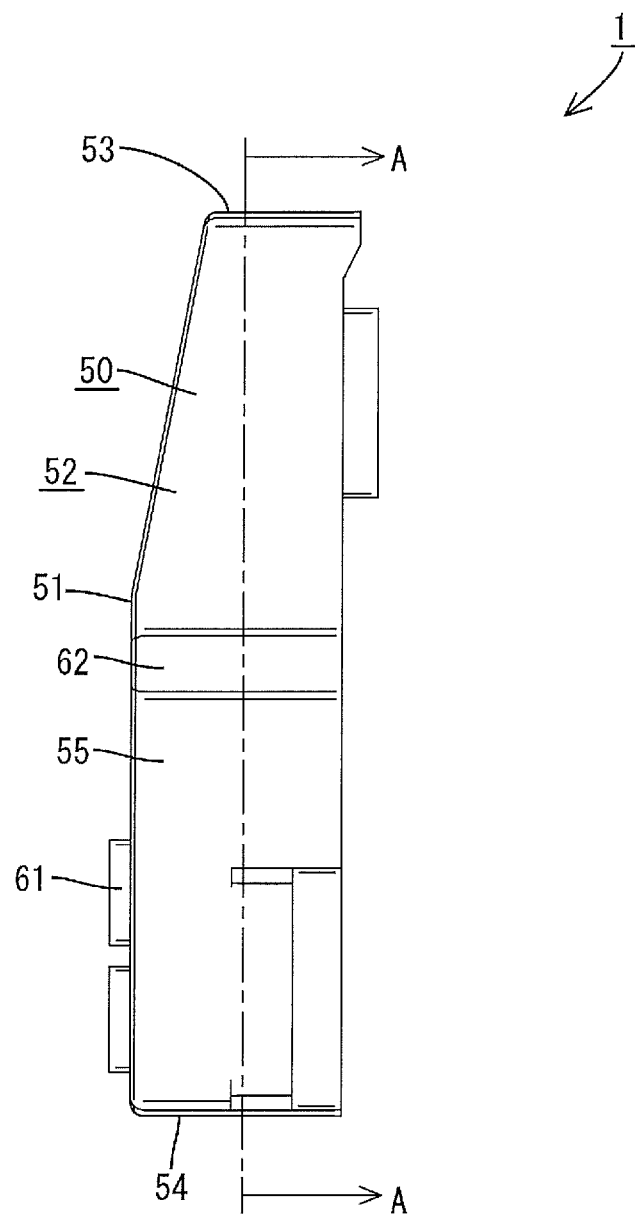
FIG. 5 is a side view of an electrical junction box according to the embodiment.
Figure 6:
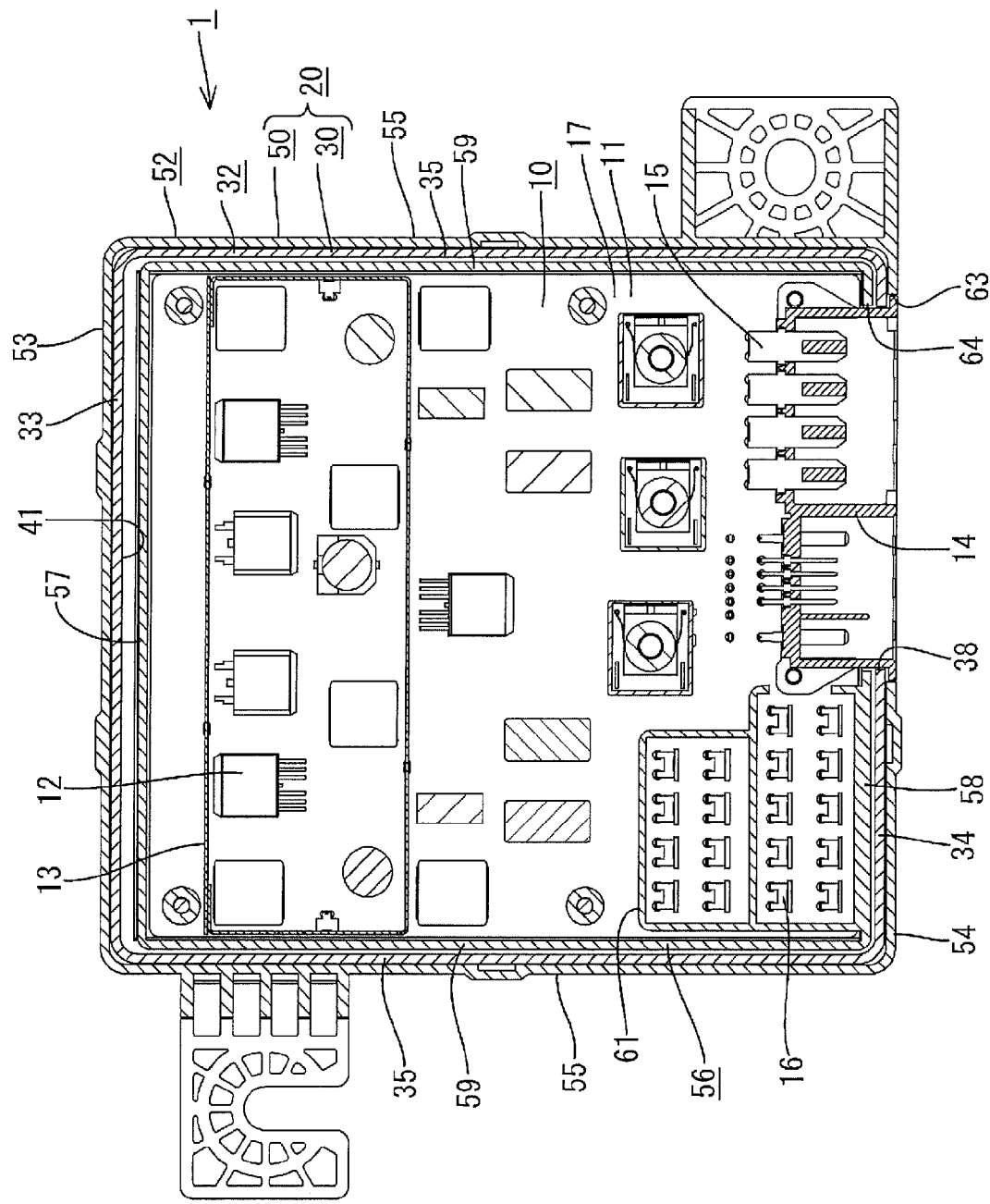
FIG. 6 is a cross-sectional view taken along A-A in FIG. 5.
Figure 7:
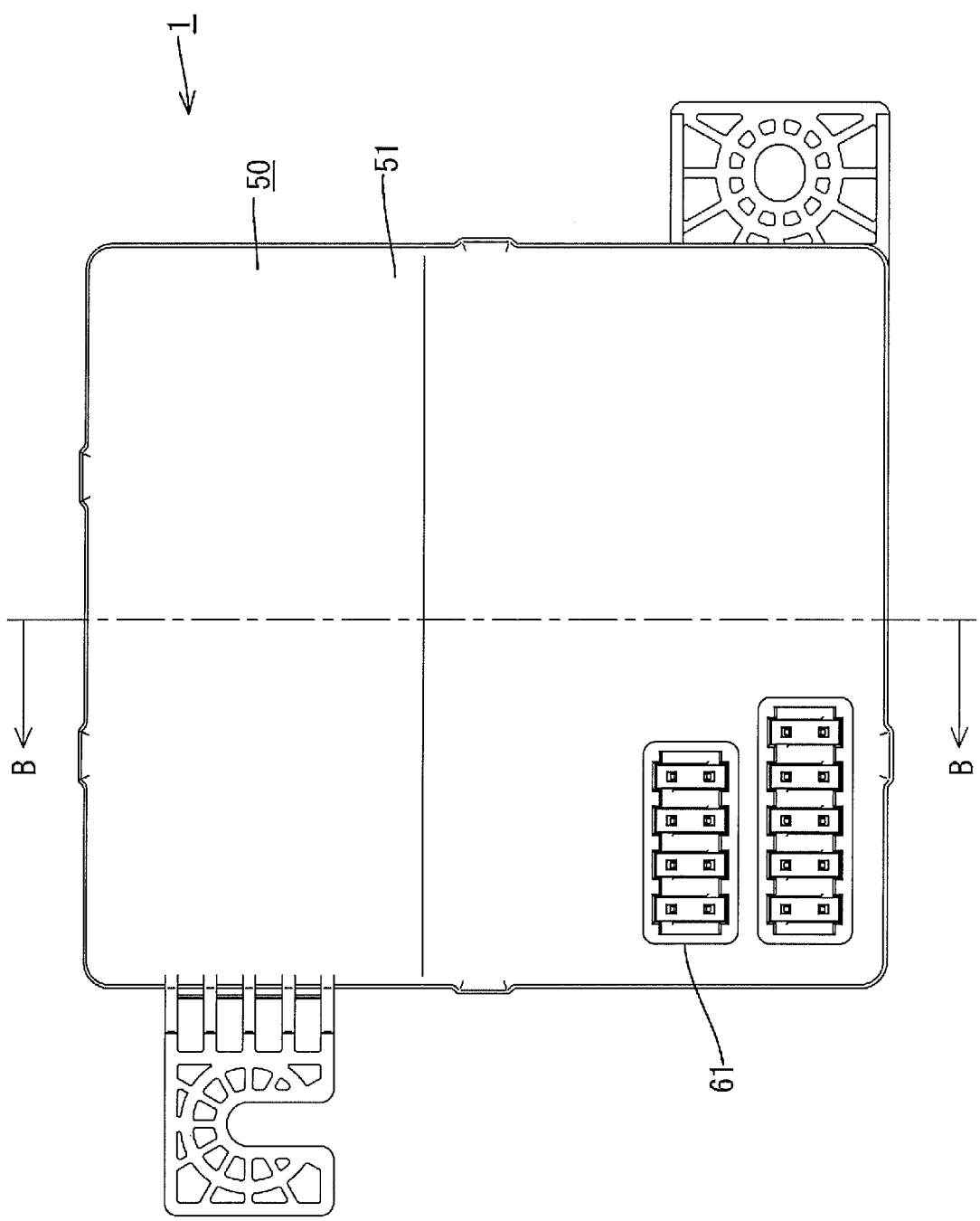
FIG. 7 shows the electrical junction box according to the embodiment as seen from the side of a lid plate portion.
Figure 8:
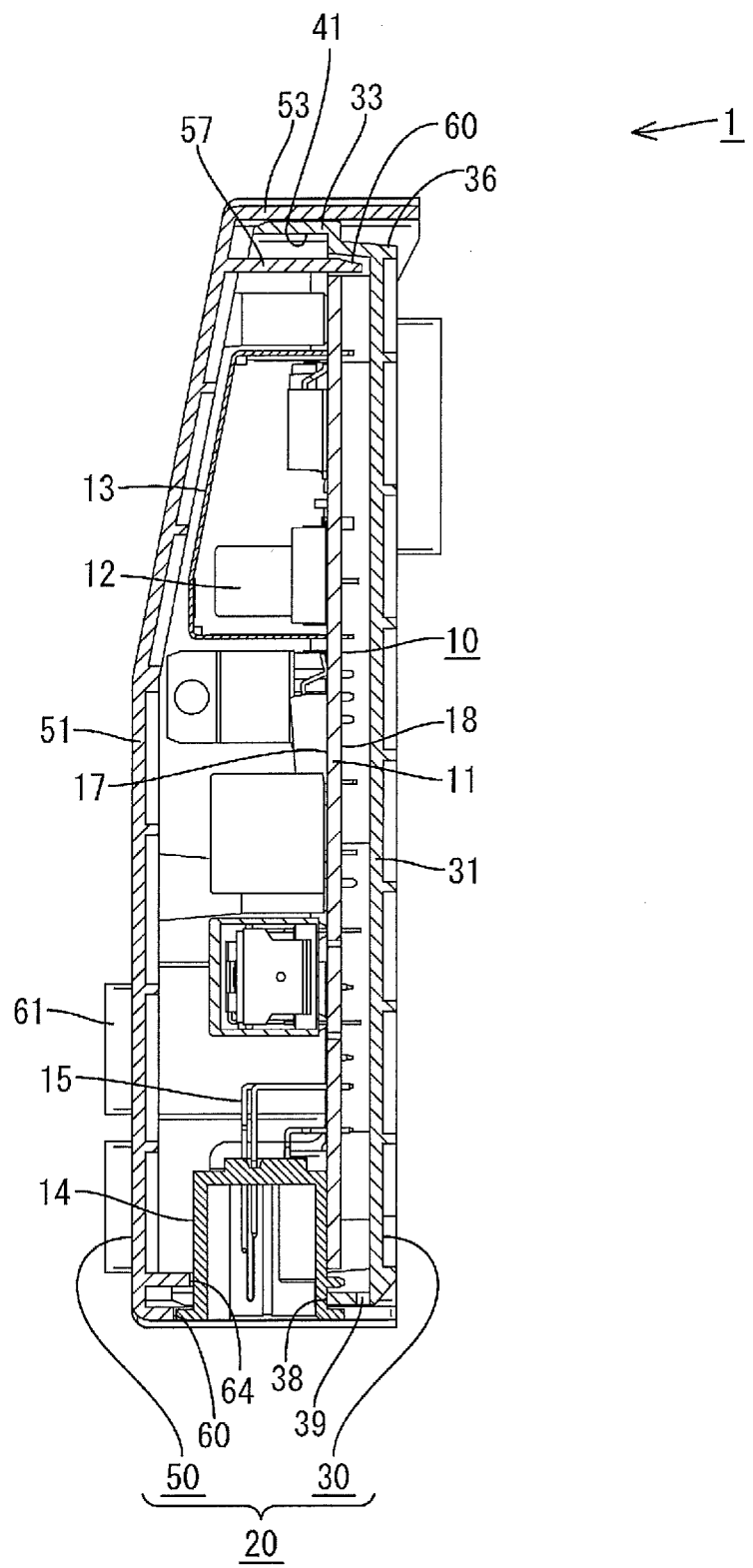
FIG. 8 is a cross-sectional view taken along line B-B in FIG. 7.

An embodiment of the present application will be described in detail with reference to FIGS. 1 to 8.

An electrical junction box 1 according to this embodiment is installed in a passenger compartment of a vehicle and used, and includes a circuit structure 10 and a casing 20 that accommodates this circuit structure 10.

The circuit structure 10 includes a circuit board 11 including a conductor circuit (not shown) and electronic components 12 mounted (installed) on a front surface (mounting surface 17) of this circuit board 11. No electronic component 12 is mounted (installed) on a back surface (non-mounting surface 18) of the circuit board 11. Some electronic components 12 of the plurality of electronic components 12 that are installed on the circuit board 11 are covered by a shield shell 13 made of a metal. Electronic components that generate radiation noise are disposed in an upper region of the mounting surface 17 of the circuit board 11, the region constituting about one-third of the mounting surface 17, and electronic components that do not generate radiation noise are disposed below that region. The shield shell 13 covers the upper region constituting about one-third of the front surface of the circuit board 11.

A connector fitting portion 14 into which a counterpart connector that is connected to a power supply or on-vehicle electrical equipment can be fitted is formed in a certain region in a lower portion of the mounting surface 17 of the circuit board 11 such that the connector fitting portion 14 opens downward. Connecting terminals 15 that are electrically connected to the conductor circuit provided in the circuit board 11 are exposed inside the connector fitting portion 14. Also, fuse terminals 16 that are electrically connected to the conductor circuit are disposed in another region in the lower portion of the front surface of the circuit board 11.

This circuit structure 10 is accommodated in the casing 20 in a portrait orientation, that is, in such an orientation that the direction in which a board surface of the circuit board 11 extends is a longitudinal direction.

The casing 20 is made of a synthetic resin, and includes a case 30 that accommodates the circuit structure 10 and a cover 50 that is attached to the case 30 so as to close an opening 41 of the case 30. The case 30 is formed in the shape of a flat box whose lateral side is open, and the circuit structure 10 is accommodated in the case 30 such that the side of the mounting surface 17 (the side on which the electronic components 12 are mounted) faces the opening 41. The case 30 includes a bottom plate portion 31 that is formed in a rectangular shape slightly larger than the circuit structure 10 and a case-side peripheral wall portion 32 that extends upright from a peripheral edge of the bottom plate portion 31. The case-side peripheral wall portion 32 includes a first upper plate portion 33 (corresponding to a case-side upper wall portion), a first lower plate portion 34, and first side plate portions 35, which are located on the upper side, the lower side, and the left and right sides, respectively, in a state in which the electrical junction box 1 is disposed in a vehicle and used.

In the case-side peripheral wall portion 32, a step is formed that extends over the entire widths of the first upper plate portion 33 and the first side plate portions 35 and a portion of the first lower plate portion 34 excluding the position in which a case-side connector opening 38 (described later) is formed. That is to say, with respect to the entire widths of the first upper plate portion 33 and the first side plate portions 35 and the portion of the first lower plate portion 34 excluding the position in which the case-side connector opening 38 is formed, the case-side peripheral wall portion 32 is shaped such that it extends from the peripheral edge of the bottom plate portion 31 toward the front side (toward the opening 41), then further extends outward from an end of the extension, and yet further extends toward the front side from an end of the outward extension, and thus the step is formed such that a region of the case-side peripheral wall portion 32 on the side of the opening 41 protrudes outward beyond a region thereof on the side of the bottom plate portion 31. It should be noted that in the first upper plate portion 33, an upper surface of the lower region (region on the side of the bottom plate portion 31) serves as a first sloping surface 36 (corresponding to a sloping surface) that slopes down toward the bottom plate portion 31 over the entire width of the first upper plate portion 33.

A plurality of support protrusions 37 are provided so as to protrude from an inner surface of the bottom plate portion 31, the support protrusions 37 being provided to support the circuit structure 10 in a state in which a space is left between the circuit structure 37 and this inner surface. The height of the support protrusions 37 is set to be lower than the height of the step surface of the case-side peripheral wall portion 32 from the bottom plate portion 31 by the thickness of the circuit board 11, and the circuit structure 10 is accommodated in the case 30 in a state in which this step surface and the surface of the circuit board 11 are at substantially the same height.

The case-side connector opening 38 for exposing the connector fitting portion 14 of the circuit structure 10 to the outside is formed in the first lower plate portion 34. The case-side connector opening 38 is formed by cutting out a portion of the first lower plate portion 34 that is in alignment with the connector fitting portion 14 of the circuit structure 10, the portion spanning from an opening-side edge portion of the first lower plate portion 34 to a certain depth. Also, in the first lower plate portion 34, a drain hole 39 for allowing water that has entered the inside of the case 30 to drain is provided in a region between the position at which the first lower plate portion 34 is joined to the bottom plate portion 31 and the portion where the case-side connector opening 38 is formed such that the drain hole 39 passes through the first lower plate portion 34 in a vertical direction.

Locking protrusions 40 for locking the cover 50 are provided on outer surfaces of the first upper plate portion 33, the first lower plate portion 34, and the first side plate portions 35.

The cover 50 is attached to the case 30 from the front side so that the cover 50 closes the opening 41 of the case 30. The cover 50 has the shape of a flat box whose back side is open, and includes a lid plate portion 51 having the shape of a substantially rectangular plate that is slightly larger than the bottom plate portion 31 of the case 30, and a cover-side peripheral wall portion 52 extending upright from a peripheral edge of the lid plate portion 51. The cover-side peripheral wall portion 52 is formed in the shape of a rectangular frame that is slightly larger than the case-side peripheral wall portion 32 such that, in a state in which the case 30 and the cover 50 are assembled, the cover-side peripheral wall portion 52 covers the outer perimeter of the case-side peripheral wall portion 32. The cover-side peripheral wall portion 52 includes a second upper plate portion 53 (corresponding to a cover-side upper wall portion), a second lower plate portion 54, and second side plate portions 55, which are located on the upper side, the lower side, and the left and right sides, respectively, in a state in which the electrical junction box 1 is disposed in the vehicle and used.

The cover-side peripheral wall portion 52 extends to at least such a position that, in a state in which the cover 50 and the case 30 are assembled, a protruding end of the cover-side peripheral wall portion 52 is substantially flush over its entire perimeter with an outer surface of the bottom plate portion 31. Furthermore, the second upper plate portion 53 extends to such a position that the protruding end thereof protrudes slightly outward beyond the outer surface of the bottom plate portion 31.

Furthermore, an inner wall portion 56 is provided so as to extend upright from an inner surface of the lid plate portion 51, the inner wall portion 56 being positioned slightly inward of the cover-side peripheral wall portion 52. The inner wall portion 56 is formed in the shape of a rectangular frame that is slightly smaller than the case-side peripheral wall portion 32, and is provided inside the cover-side peripheral wall portion 52 so as to extend upright with just enough space to receive the case-side peripheral wall portion 32 provided between the cover-side peripheral wall portion 52 and the inner wall portion 56. Thus, in a state in which the case 30 and the cover 50 are assembled, the case-side peripheral wall portion 32 can be received between the cover-side peripheral wall portion 52 and the inner wall portion 56. At the same time, the inner wall portion 56 is formed to be slightly larger than the circuit structure 10 so that the circuit structure 10 can be received on the inside of the inner wall portion 56. The inner wall portion 56 includes a third upper plate portion 57 (corresponding to a waterproof wall), a third lower plate portion 58, and a pair of left and right third side plate portions 59, which are disposed to the inside of the second upper plate portion 53, the second lower plate portion 54, and the pair of second side plate portions 55, respectively, of the cover-side peripheral wall portion 52.

The inner wall portion 56 extends to at least such a position that, in a state in which the circuit structure 10 is accommodated in the casing 20, a protruding end of the inner wall portion 56 is substantially flush over its entire perimeter with the non-mounting surface 18 of the circuit board 11. Furthermore, the third upper plate portion 57 extends to such a position that its protruding end is positioned slightly closer to the bottom plate portion 31 than the back surface of the circuit board 11 is, and is slightly spaced apart from the inner surface of the bottom plate portion 31 of the case 30 so as to be closer to the lid plate portion 51 than the inner surface of the bottom plate portion 31 is.

A region of the third upper plate portion 57 that spans from the protruding end to a position that is slightly shifted toward the lid plate portion 51 from the protruding end serves as a second sloping surface 60 that slopes down toward the protruding end (the side of the bottom plate portion 31) over the entire width of the third upper plate region 57.

A fuse attachment portion 61 to which fuses can be attached is formed in a lower portion of a front surface of the lid plate portion 51 such that the fuse attachment portion 61 opens to the front surface side. The fuse terminals 16 provided in the circuit structure 10 are exposed inside the fuse attachment portion 61.

A plurality of lock receiving portions 62 that engage with the locking protrusions 40 of the case 30 are provided on inner surfaces of the second upper plate portion 53, the second lower plate portion 54, and the second side plate portions 55.

In the second lower plate portion 54 and the third lower plate portion 58, a cover-side connector opening 63 and an inner wall portion-side connector opening 64, respectively, are formed at positions that are in alignment with the case-side connector opening 38. The cover-side connector opening 63 and the inner wall portion-side connector opening 64 are formed by cutting out portions of the second lower plate portion 54 and the third lower plate portion 58, respectively, that are in alignment with the connector fitting portion 14 of the circuit structure 10, the portions spanning from opening-side edge portions of the second lower plate portion 54 and the third lower plate portion 58 to a certain depth. Thus, the connector fitting portion 14 of the circuit structure 10 is exposed to the outside from the inner wall portion-side connector opening 64, the case-side connector opening 38, and the cover-side connector opening 63. It should be noted that the drain hole 39, which is formed in the first lower plate portion 34, is also exposed to the outside from the cover-side connector opening 63.

Next, procedures for assembling the case 30, the cover 50, and the circuit structure 10 that are configured as described above will be described.

First, the circuit structure 10 is accommodated in the case 30 such that the mounting surface 17 (surface on which the electronic components 12 are installed) faces the opening 41 of the case 30, and the non-mounting surface 18 faces the bottom plate portion 31. At this time, the circuit structure 10 rests on the support protrusions 37, so that a space serving as a water passage is secured between the non-mounting surface 18 of the circuit structure 10 and the inner surface of the bottom plate portion 31.

Next, the cover 50 is attached from the opening side of the case 30. At this time, the case-side peripheral wall portion 32 is inserted between the cover-side peripheral wall portion 52 and the inner wall portion 56. At the same time, the circuit structure 10 is inserted into the inside of the inner wall portion 56. Then, the locking protrusions 40 and the lock receiving portions 62 engage, thereby bringing the case 30 and the cover 50 into engagement with each other.

The assembled electrical junction box 1 is installed, for example, at a predetermined position in the vehicle, that is, in the passenger compartment of the vehicle in an orientation in which the first upper plate portion 33, the second upper plate portion 53, and the third upper plate portion 57 face upward, and the circuit structure 10, which is accommodated in the electrical junction box 1, is in a portrait position, and used.

Next, the effects of this embodiment will be described.

The electrical junction box 1 according to this embodiment is installed in the passenger compartment of a vehicle, that is, a location where it is basically protected from the rain, wash water used in vehicle washing, and the like, but a case is conceivable in which a small amount of water splashes onto the electrical junction box 1 when, for example, a passenger spills water in the passenger compartment.

Here, the electrical junction box 1 according to this embodiment includes the circuit structure 10 and the casing 20 in which the circuit structure 10 is accommodated. The casing 20 includes the case 30, which includes the bottom plate portion 31 and the case-side peripheral wall portion 32 extending upright from the peripheral edge of the bottom plate portion 31, which opens to the lateral side, and which can accommodate the circuit structure 10 inside, and the cover 50, which closes the opening 41 of the case 30 and includes the lid plate portion 51 and the cover-side peripheral wall portion 52 extending upright from the peripheral edge of the lid plate portion 51 and covering the perimeter of the case-side peripheral wall portion 32.

With this configuration, in the state in which the case 30 and the cover 50 are assembled, the peripheral wall portion of the casing has a double structure constituted by the case-side peripheral wall portion 32 and the cover-side peripheral wall portion 52. Furthermore, the cover 50 includes the inner wall portion 56, which is provided inside the cover-side peripheral wall portion 52 so as to extend upright with just enough space to receive the case-side peripheral wall portion 32 provided between the cover-side peripheral wall portion 52 and the inner wall portion 56 and which is formed to have a size that allows the circuit structure 10 to be received in the inside of the inner wall portion 56.

With this configuration, in the state in which the case 30 and the cover 50 are assembled, the peripheral wall portion has a triple structure constituted by the case-side peripheral wall portion 32, the cover-side peripheral wall portion 52, and the inner wall portion 56, and the circuit structure 10 is surrounded by a triple wall. Therefore, entry of water to the inside of the case 30 and resulting adhesion of water to the circuit structure are suppressed.

Also, the cover-side peripheral wall portion 52 extends to at least such a position that, in a state in which the cover 50 and the case 30 are assembled, the protruding end of the cover-side peripheral wall portion 52 is substantially flush with the outer surface of the bottom plate portion 31.

Here, if the protruding end of the cover-side peripheral wall portion 52 is positioned closer to the lid plate portion 51 than the outer surface of the bottom plate portion 31 is, a portion of the outer peripheral surface of the case-side peripheral wall portion 32 is exposed from the cover-side peripheral wall portion 52. Thus, there is a risk of adhesion of water to the exposed surface, resulting in entry of the adhering water to the inside through a space between the case-side peripheral wall portion 32 and the cover-side peripheral wall portion 52 by capillary action. However, according to this embodiment, the cover-side peripheral wall portion 52 extends to at least such a position that the protruding end thereof is substantially flush with the outer surface of the bottom plate portion 31, and therefore the entire surface of the case-side peripheral wall portion 32 is exposed from the cover-side peripheral wall portion 52. For this reason, the above-described situation can be avoided. Thus, entry of water to the inside of the case 30 can be more reliably avoided.

Furthermore, the circuit structure 10 includes the circuit board 11 and the electronic components 12 that are mounted on the mounting surface 17 of the circuit board 11, and is accommodated in the case 30 with the surface on the side on which the electronic components 12 are mounted facing the opening 41. The inner wall portion 56 extends to at least such a position that, in a state in which the circuit structure 10 is accommodated in the casing 20, the protruding end of the inner wall portion 56 is substantially flush with the back surface of the circuit board 11.

With this configuration, even if water enters the inside of the cover-side peripheral wall portion 52, the water moves on the outer peripheral surface of the inner wall portion 56 and is guided to the side of the non-installation surface 18 of the circuit board 11. For this reason, even if water enters the inside of the casing 20, adhesion of the water to the surface (mounting surface 17) of the circuit board 11 on which the electronic components 12 are mounted is avoided.

Also, a water blocking structure as described above can be attained with a relatively small increase in the cost as compared with a case structure with respect to which no countermeasure is taken. For this reason, the electrical junction box 1 having a water blocking structure can be provided at low cost.

The present application is not limited to the foregoing description and the embodiment that has been described using the drawings, and, for example, embodiments as described below are also embraced within the technical scope of the present application.

(1) In the foregoing embodiment, the peripheral wall portion of the casing 20 has the triple structure that is constituted by the case-side peripheral wall portion 32, the cover-side peripheral wall portion 52, and the inner wall portion 56. However, even if no inner wall portion is provided, and the peripheral wall portion has a double structure that is constituted by the case-side peripheral wall portion 32 and the cover-side peripheral wall portion 52, entry of water to the inside of the case and resulting adhesion of water to the circuit structure are suppressed to some extent, and the effects of the present application are achieved.

(2) In the foregoing embodiment, the peripheral wall portion of the casing 20 over the entire perimeter thereof has the triple structure that is constituted by the case-side peripheral wall portion 32, the cover-side peripheral wall portion 52, and the inner wall portion 56. However, for example, a configuration is also possible in which the peripheral wall portion is partially provided with the inner wall portion, and the peripheral wall portion thus partially has a triple structure.

The invention claimed is:

1. An electrical junction box configured to be installed in a passenger compartment of a vehicle, the electrical junction box comprising a casing having a case portion and a cover portion, and a circuit structure within the case portion,
   wherein the case portion of the casing comprises a bottom plate portion and a case-side peripheral wall portion that extends upright from a peripheral edge of the bottom plate portion, the case portion having an opening that opens to a lateral side, and the case portion accommodates the circuit structure therein;
   wherein the cover portion of the casing closes the opening of the case portion and comprises a lid plate portion and a cover-side peripheral wall portion that extends upright from a peripheral edge of the lid plate portion and covers a perimeter of the case-side peripheral wall portion of the case portion,
   wherein in a configuration in which the cover portion and the case portion are assembled, a protruding end of the cover-side peripheral wall portion extends to at least such a position that the protruding end is substantially flush with an outer surface of the bottom plate portion, and
   wherein the case portion and the cover portion are assembled by engagement of locking protrusions that are formed on an outer surface of the case-side peripheral wall portion of the case portion with lock receiving portions that are formed on an inner surface of the cover-side peripheral wall portion of the cover portion.

2. The electrical junction box according to claim 1,
   wherein the cover portion further comprises an inner wall portion extending upright such that, in a configuration in which the cover portion and the case portion are assembled, the inner wall portion of the cover portion is located at a position to the inside of the case-side peripheral wall portion of the case portion with a space provided between the case-side peripheral wall portion and the inner wall portion, and the circuit structure is located inside of the inner wall portion.

3. The electrical junction box according to claim 2,
   wherein the circuit structure comprises a circuit board and electronic components mounted on a mounting surface of the circuit board,
   wherein the circuit board is accommodated in the case portion such that the mounting surface of the circuit board faces the opening, and
   wherein a protruding end of the inner wall portion of the cover portion extends to at least such a position that the protruding end is substantially flush with a non-mounting surface of the circuit board on which the electronic components are not mounted.

4. The electrical junction box according to claim 3,
   wherein the inner wall portion includes a waterproof wall, and wherein a protruding length of the waterproof wall is set at such a length that a protruding end of the waterproof wall is positioned closer to the bottom plate portion of the case portion than the non-mounting surface of the circuit board, and the protruding end of the waterproof wall is slightly spaced apart from an inner surface of the bottom plate portion of the case portion.

5. The electrical junction box according to claim 4, wherein a sloping surface is formed on an upper surface of the waterproof wall, the sloping surface sloping down toward the bottom plate portion of the case portion in a configuration in which the cover portion and the case portion are assembled.

6. The electrical junction box according to claim 2, wherein in a configuration in which the case portion and the cover portion are assembled, the case-side peripheral wall portion of the case portion is received between the cover-side peripheral wall portion of the cover portion and the inner wall portion of the cover portion.

7. The electrical junction box according to claim 1, wherein the cover-side peripheral wall portion of the cover portion includes a cover-side upper wall portion that extends to such a position that a protruding end of the cover-side upper wall portion protrudes slightly outward beyond the outer surface of the bottom plate portion of the case portion.

8. The electrical junction box according to claim 1, wherein a drain hole is formed in at least one of a case-side lower wall portion of the case-side peripheral wall portion that is located on a lower side of the electrical junction box in a configuration in which the electrical junction box is used and a cover-side lower wall portion of the cover-side peripheral wall portion that is located on the lower side of the electrical junction box in the configuration in which the electrical junction box is used, the drain hole passing through the at least one of the case-side lower wall portion and the cover-side lower wall portion in a vertical direction.

* * * * *